(12) United States Patent
Lu et al.

(10) Patent No.: US 6,440,836 B1
(45) Date of Patent: Aug. 27, 2002

(54) METHOD FOR FORMING SOLDER BUMPS ON FLIP CHIPS AND DEVICES FORMED

(75) Inventors: Szu-Wei Lu; Ling-Chen Kung, both of Hsinchu; Ruoh-Huey Uang, Taipei; Hsu-Tien Hu, Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/268,785

(22) Filed: Mar. 16, 1999

(51) Int. Cl.$^7$ .............................. H01L 21/44; G03C 5/00
(52) U.S. Cl. .................... 438/612; 438/613; 430/312; 430/313; 430/318
(58) Field of Search ................................ 438/612, 613, 438/761; 430/312, 313, 318

(56) References Cited

U.S. PATENT DOCUMENTS

| | | | | |
|---|---|---|---|---|
| 5,270,253 A | * | 12/1993 | Arai | 437/189 |
| 5,888,892 A | * | 3/1999 | Yanagida | 438/614 |
| 6,162,718 A | * | 12/2000 | Boettcher | 438/613 |
| 6,268,114 B1 | * | 7/2001 | Wen et al. | 430/314 |

* cited by examiner

Primary Examiner—Tuan H. Nguyen
Assistant Examiner—Nema Berezny
(74) Attorney, Agent, or Firm—Tung & Associates

(57) ABSTRACT

The present invention discloses a dual-photoresist method for forming fine-pitched solder bumps on flip chips by utilizing two separate layers of photoresist, i.e., a first thin photoresist layer for patterning the BLM layers on top of the aluminum bonding pads and a second thick photoresist layer for patterning the via openings on top of the BLM layers to supply the necessary thickness required for the solder bumps. The first, thin photoresist layer permits an accurate imaging process to be conducted without focusing problems which are normally associated with thick photoresist layers. As an optional step, the present invention may further utilize a thin layer of non-leachable metal such as Cu or Ni for coating on top of the BLM layer and thus further improving the electrical characteristics of the solder bumps subsequently formed thereon. A majority of the BLM layer is removed with the first, thin photoresist layer and thus, in the final BLM removal process, only a very thin adhesion sublayer of the BLM layer needs to be removed and as a result, ensures a clean removal process without damaging the solder bumps already formed with a fine-pitch.

19 Claims, 5 Drawing Sheets

METHOD FOR FORMING SOLDER BUMPS ON FLIP CHIPS AND DEVICES FORMED

FIELD OF THE INVENTION

The present invention generally relates to a method for forming solder bumps on flip chips and devices formed, and more particularly, relates to a method for forming fine-pitched solder bumps on flip chips by a dual-photoresist method in which a thin photoresist is first used to define the solder bumps on a BLM (ball-limiting-metallurgy) layer and then a thick photoresist layer is used for defining the height of the solder bumps so that the accuracy for placement of the solder bumps can be greatly improved and devices formed by the method.

BACKGROUND OF THE INVENTION

In the fabrication of modem semiconductor devices, the ever increasing device density and decreasing device dimensions demand more stringent requirements in the packaging or interconnecting techniques of such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become impractical for several reasons. One of the problems in utilizing solder paste screening technique in bonding modem semiconductor devices is the paste composition itself. A solder paste is formed by a flux material and solder alloy particles. The consistency and uniformity of the solder paste composition become more difficult to control as the solder bump volume decreases. Even though a solution of the problem has been proposed by using solder paste that contain extremely small and uniform solder particles, it can only be achieved at a high cost penalty. A second problem in utilizing the solder paste screening technique in modem high density semiconductor devices is the available space between solder bumps. It is known that a large volume reduction occurs when a solder changes from a paste state to a cured stated, the screen holes for the solder paste must be significantly larger in diameter than the actual solder bumps to be formed. The large volume shrinkage ratio thus makes the solder paste screening technique difficult to carry out in high density devices.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, the thin film electrodeposition technique which also requires a ball limiting metallurgy layer to be deposited and defined by an etching process which has the same limitations as the C4 technique. For instance, a conventional thin film electrodeposition process for depositing solder bumps is shown in FIGS. 1A~1F.

A conventional semiconductor structure 10 is shown in FIG. 1A. The semiconductor structure 10 is built on a silicon substrate 12 with active devices built therein. A bond pad 14 is formed on a top surface 16 of the substrate 12 for making electrical connections to the outside circuits. The bond pad 14 is normally formed of a conductive metal such as aluminum. The bond pad 14 is passivated by a final passivation layer 20 with a window 22 opened by a photolithography process to allow electrical connection to be made to the bond pad 14. The passivation layer 20 may be formed of any one of various insulating materials such as oxide, nitride or organic materials. The passivation layer 20 is applied on top of the semiconductor device 10 to provide both planarization and physical protection of the circuits formed on the device 10.

Onto the top surface 24 of the passivation layer 20 and the exposed top surface 18 of the bond pad 14, is then deposited an under bump metallurgy layer 26. This is shown in FIG. 1B. The under bump metallurgy (UBM) layer 26 normally consists of an adhesion diffusion barrier layer 30 and a wetting layer 28. The adhesion diffusion barrier layer 30 may be formed of Ti, TiW or other metal such as Cr. The wetting layer 28 is normally formed of a Cu layer or a Ni layer. The UBM layer 26 improves bonding between a solder ball to be formed and the top surface 18 of the bond pad 14.

In the next step of the process, as shown in FIG. 1C, a photoresist layer 34 is deposited on top of the UBM layer 26 and then patterned to define a window opening 38 for the solder ball to be subsequently formed. In the following electrodeposition process, a solder ball 40 is electrodeposited into the window opening 38 forming a structure protruded from the top surface 42 of the photoresist layer 34. The use of the photoresist layer 34 must be carefully controlled such that its thickness is in the range between about 30 μm and about 40 μm, preferably at a thickness of about 35 μm. The reason for the tight control on the thickness of the photoresist layer 34 is that, for achieving a fine-pitched solder bump formation, a photoresist layer of a reasonably small thickness must be used such that a high imaging resolution can be achieved. It is known that, during a photolithography process, the thicker the photoresist layer, the poorer is the imaging process. To maintain a reasonable accuracy in the imaging process on the photoresist layer 34, a reasonably thin photoresist layer 34 must be used which results in a mushroom configuration of the solder bump 40 deposited therein. The mushroom configuration of the solder bump 40 contributes greatly to the inability of a conventional process in producing fine-pitched solder bumps.

Referring now to FIG. 1E, wherein the conventional semiconductor structure 10 is shown with the photoresist layer 34 removed in a wet stripping process. The mushroom-shaped solder bump 40 remains while the under bump metallurgy layer 26 is also intact. In the next step of the process, as shown in FIG. 1F, the UBM layer 26 is etched away by using the solder bump 40 as a mask in an wet etching process. The solder bump 40 is then heated in a reflow process to form solder ball 44. The reflow process is conducted at a temperature that is at least the reflow temperature of the solder material.

The conventional method for depositing solder bumps described above presents a number of processing difficulties. For instance, one of the difficulties is the large volume of solder used in a mushroom-shaped bump which impedes the process of making fine-pitched bumps. By fine-pitched bumps, it is meant that the distance maintained between the bases of the bumps is less than 150 μm, and preferably less than 120 μm. In a conventional method, the solder bumps are planted before a BLM layer deposited under the bumps is removed, i.e., the BLM layer is not patterned prior to the solder bump planting step. A BLM layer removal process after the bumps are planted in place such as a wet etching process is therefore necessary. When fine-pitched bumps are planted such that little spaces are left between the bumps, a complete removal of the BLM layer between the bumps becomes difficult. An extended length of time for the etching process is therefore necessary which leads to possible attacks on the solder bumps by the etchant and possible oxidation of the bumps. Another drawback of the conventional fine-pitched bump planting process is the necessity of using a thick photoresist layer in order to achieve the height of the bumps. It is known in photolithography that the thicker the photoresist layer used, the more difficult it is to achieve high accuracy in the imaging of the pattern in the photoresist layer due to focusing difficulties. Poor accuracy in the imaging process leads to misplacement of the solder bumps in relation to the positions of the bond pads. Serious reliability problems may result when the aluminum bonding pads are not completely covered by the solder bumps. The conventional method for planting fine-pitched solder bumps therefore leaves much to be desired and does not provide solder bumps of high quality and reliability.

It is therefore an object of the present invention to provide a method for forming fine-pitched solder bumps on flip chips that does not have the drawbacks or shortcomings of the conventional methods.

It is another object of the present invention to provide a method for forming fine-pitched solder bumps on flip chips by utilizing at least two photolithographic processes.

It is a further object of the present invention to provide a method for forming fine-pitched solder bumps on flip chips by first defining a BLM layer prior to the planting of solder bumps.

It is another further object of the present invention to provide a method for forming fine-pitched solder bumps on flip chips wherein the bump-to-bump distance may by smaller than 120 μm.

It is still another object of the present invention to provide a dual-photoresist method for forming fine-pitched solder bumps on flip chips by first using a thin photoresist layer to pattern a BLM layer and then using a thick photoresist layer to define window openings for the solder bumps.

It is yet another object of the present invention to provide a dual-photoresist method for forming fine-pitched solder bumps on flip chips wherein a BLM layer coated between the bumps can be thoroughly removed by a wet etching process.

It is still another further object of the present invention to provide a dual-photoresist method for forming fine-pitched solder bumps on flip chips wherein a non-leachable metal layer such as Cu or Ni is first deposited on top of an etched BLM layer prior to the planting of the solder bumps for use as an electrode layer during the electroplating process.

It is yet another further object of the present invention to provide solder bumps that are formed on a flip chip wherein the solder bumps are joined to a BLM layer with an interface thereinbetween comprising atoms of a non-leachable metal such as Cu or Ni.

SUMMARY OF THE INVENTION

In accordance with the present invention, a method for forming fine-pitched solder bumps on flip chips and devices formed by such a method are disclosed.

In a preferred embodiment, a dual-photoresist method for forming fine-pitched solder bumps on flip chips may be carried out by the operating steps of providing an electronic substrate which has a bond pad formed on top, the bond pad is embedded in an insulating layer with only a top surface exposed, depositing a BLM layer on top of the electronic substrate, coating a first photoresist layer on top of the BLM layer, the first photoresist layer has a first thickness that is sufficiently small such that an exposure accuracy of a least ±2 μm can be achieved, etching the first layer of BLM layer away except areas over the bond pads, coating a second photoresist layer on top of the etched BLM layer, the second photoresist layer has a second thickness that is larger than the first thickness, forming a via opening in the second photoresist layer over the BLM layer and filling with a solder to form a solder bump, and removing the second photoresist layer and reflowing the solder bump into a solder ball.

The dual-photoresist method for forming fine-pitched solder bumps on flip chips may further include the step of depositing a none-leachable metal layer on top of the etched BLM layer prior to the coating step for the second photoresist layer, the non-leachable metal does not leach into a solder bump material that is subsequently deposited on top. The non-leachable metal layer may be formed of a metal that has high electrical conductivity. The non-leachable metal layer may be deposited of a material selected from the group consisting of Cu and Ni. The non-leachable metal layer may be deposited to a thickness of not more than 1 μm, to a thickness between about 0.01 μm and about 1 μm, or preferably to a thickness between 0.05 μm and 0.3 μm. The electronic substrate may be a silicon wafer.

In the dual-photoresist method for forming fine-pitched solder bumps on flip chips, the BLM layer may include at least two sublayers selected from the group consisting of an adhesion sublayer, a barrier sublayer and a bonding sublayer. The adhesion sublayer may be formed of a metal such as Cr or Ti, the barrier sublayer may be formed of a metal such as Cu, Pd, Pt or Ni, and the bonding sublayer may be formed of a metal such as Au and Pt. The first thickness of the first photoresist layer may be not more than 10 μm, and preferably between about 2 μm and about 5 μm. The second thickness of the second photoresist layer is substantially similar to the height of the solder bumps planted in the via opening formed in the second photoresist layer. The second thickness of the second photoresist layer may be sufficient to a solder ball after reflow to a thickness of not less than 50 μm. The step of filling the via opening with a solder may be carried out by a method of either electroplating.

In an alternate embodiment, a method for forming fine-pitched solder bumps on a silicon wafer may be carried out by the operating steps of first providing a silicon wafer that has a multiplicity of bond pads formed on top, then depositing a BLM layer on top of the multiplicity of bond pads, then coating and patterning a first photoresist layer on top of the BLM layer, the first photoresist layer is coated to a thickness not more than 10 μm, etching the BLM layer away except on top of the multiplicity of bond pads, coating and patterning a second photoresist layer on top of the etched BLM layer, the second photoresist layer is coated to a thickness of at least 50 μm, defining and forming a multiplicity of via opening in the second photoresist layer to expose the multiplicity of bond pads, filling the multiplicity of via opening with a solder material to form a multiplicity of solder bumps, and removing the second photoresist layer.

The method for forming fine-pitched solder bumps on a silicon wafer may further include the step of reflowing the multiplicity of solder bumps into a multiplicity of solder balls. The method may further include the step of depositing a non-leachable layer on top of the etched BLM layer prior to the coating of the second photoresist layer. The non-leachable metal is defined as a metal that does not leach into a solder bump material which is subsequently deposited on top of the non-leachable metal layer. The non-leachable metal layer may be deposited of Cu or Ni to a thickness of not more than 1 μm. The non-leachable metal layer may be deposited to a thickness between about 0.01 μm and 1 μm, and preferably between about 0.05 μm and about 0.3 μm.

The present invention is further direct to a solder ball that is formed on a silicon wafer which includes a pre-processed silicon wafer which has a top surface, a bond pad on the top surface, a BLM layer on the bond pad, and a solder ball integrally joined to the BLM layer with an interface thereinbetween, the interface includes atoms of a non-leachable metal of Cu or Ni.

In the solder ball formed on a silicon wafer, the BLM layer may further include an adhesion layer and a diffusion barrier layer. The BLM layer may be selected from the group consisting of Ti/Cu, TiW/Cu, Cr/Ni, Al/Ni—V/Cu and Cr/CrCu/Cu/Au. The solder ball may include Sn and Pb.

BRIEF DESCRIPTION OF THE DRAWINGS

These objects, features and advantages will become apparent from a close examination of the following specification and the appended drawings in which.

DETAILED DESCRIPTION OF THE PREFERRED AND ALTERNATE EMBODIMENTS

Figure 1A:
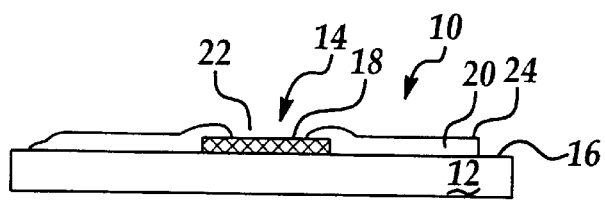
FIG. 1A is an enlarged, cross-sectional view of a conventional pre-processed substrate which has a bond pad and a passivation layer formed on top.
Figure 1B:
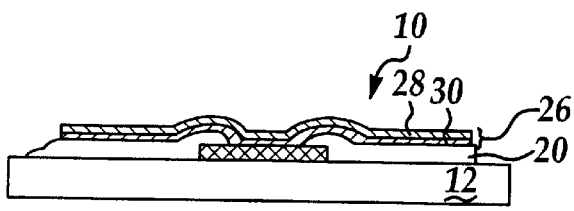
FIG. 1B is an enlarged, cross-sectional view of the conventional semiconductor structure of FIG. 1A which has an under bump metallurgy layer formed on top.
Figure 1C:
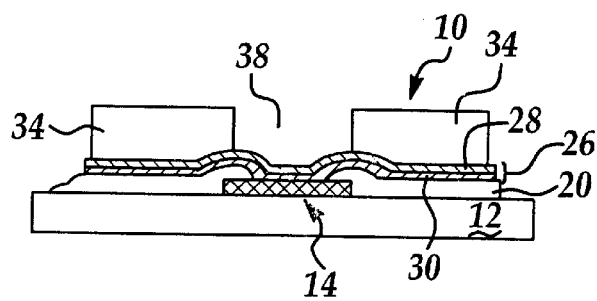
FIG. 1C is an enlarged, cross-sectional view of the conventional semiconductor structure of FIG. 1B which has a photoresist layer deposited and defined on top.
Figure 1D:
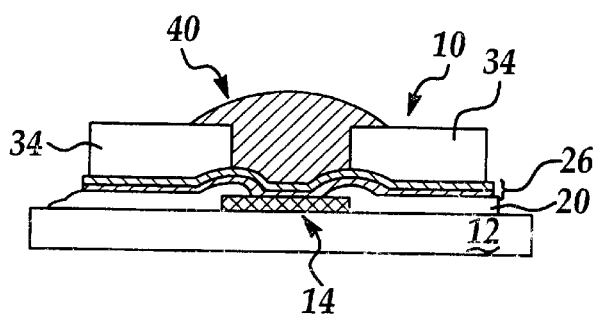
FIG. 1D is an enlarged, cross-sectional view of the conventional semiconductor structure of FIG. 1C which has a solder material deposited into the window for the solder bump.
Figure 1E:
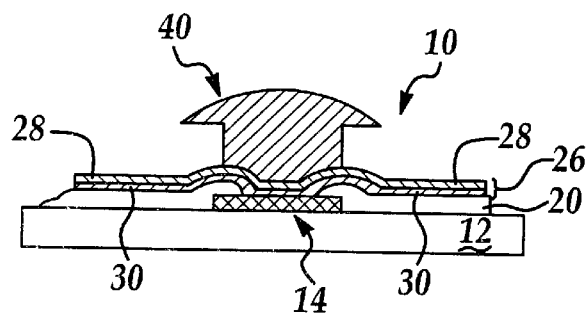
FIG. 1E is an enlarged, cross-sectional view of the conventional semiconductor structure of FIG. 1D which has the photoresist layer removed in a wet etching process.
Figure 1F:
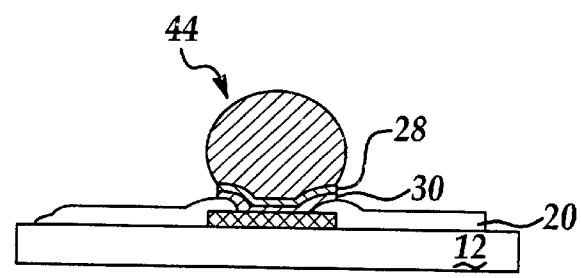
FIG. 1F is an enlarged, cross-sectional view of the conventional semiconductor structure of FIG. 1E which has the exposed under bump metallurgy layer removed and the solder bump reflowed into a solder ball.

The present invention discloses a method for forming fine-pitched solder bumps on flip chip by utilizing an unique and novel process in which two separate layers of photoresist material are used for the process. A first thin layer of photoresist is used for defining the BLM layer on top of the bond pads for bonding to the solder bumps and a second, thick photoresist is used for defining the solder bumps and building the bumps to a required height. For instance, the first, thin layer of photoresist material may have a thickness of not more than 10 μm, and preferably a thickness between about 10 μm and about 5 μm such that a high accuracy pattern can be reproduced on the electronic substrate without exposure/focusing problems that are normally associated with application utilizing thick photoresist layers, i.e., layers of more than 50 μm thick. The first, thin photoresist layer is used to define the BLM layer that covers each of the bond pads for improved bonding with the solder bumps planted thereon. After the BLM layers on the bond pads are defined, the first photoresist layer is removed together with the BLM layer outside the bond pad areas. The novel use of the thin photoresist layer therefore eliminates a problem frequently observed in the conventional method for forming fine-pitched solder bumps, i.e., the difficulty of removing BLM layer inbetween fine-pitched bumps after the solder bumps are planted.

The present invention novel method further discloses the use of a second, thicker photoresist layer for defining via openings for the solder bumps and providing the necessary height for the bumps. A photoresist layer of substantially larger thickness than that of the first photoresist layer, i.e., a thickness of larger than 50 μm, is normally used. This layer is used for defining the fine-pitched solder bumps and ensuring a minimum thickness of the bumps is met such that a sufficient amount of the solder material can be deposited into the via openings defined in the photoresist layer.

The present invention novel method further discloses the novel use of a non-leachable metal layer deposited between the BLM layer and the solder bumps. The non-leachable metal layer may be suitably formed of Cu or Ni which are both high electrical conductivity material. The non-leachable metal layer further improves the electrical communication between the bond pad and the solder bumps subsequently deposited. The thickness of the non-leachable metal layer deposited is very thin, i.e., in the range of less than 1 μm, or between about 0.01 μm and about 1 μm, or preferably between about 0.05 μm and about 0.3 μm. By non-leachable, it is meant that the metal layer will not leach into the solder bump material subsequent to the deposition of the bumps and thus providing an interface of improved electrical conductivity.

The ball-limiting-metallurgy layer utilized in the present invention may include two or three sublayers, i.e., an adhesion layer, a diffusion barrier layer and/or a wetting layer. Suitable combination such as Ti/Cu, TiW/Cu, Cr/Ni, Al/Ni—V/Cu, or Cr/CrCu/Cu/Au may be used in the present invention novel method. Other suitable BLM layers formed of other metallic materials may also be utilized in the present invention novel process. The BLM layer may be deposited as a thin film and then etched or may be deposited by an electroless plating technique. However, in the present invention novel process, the film deposition method is utilized such that all the excess BLM layers inbetween the solder bumps are etched away prior to the deposition of the solder bumps.

Figure 2:
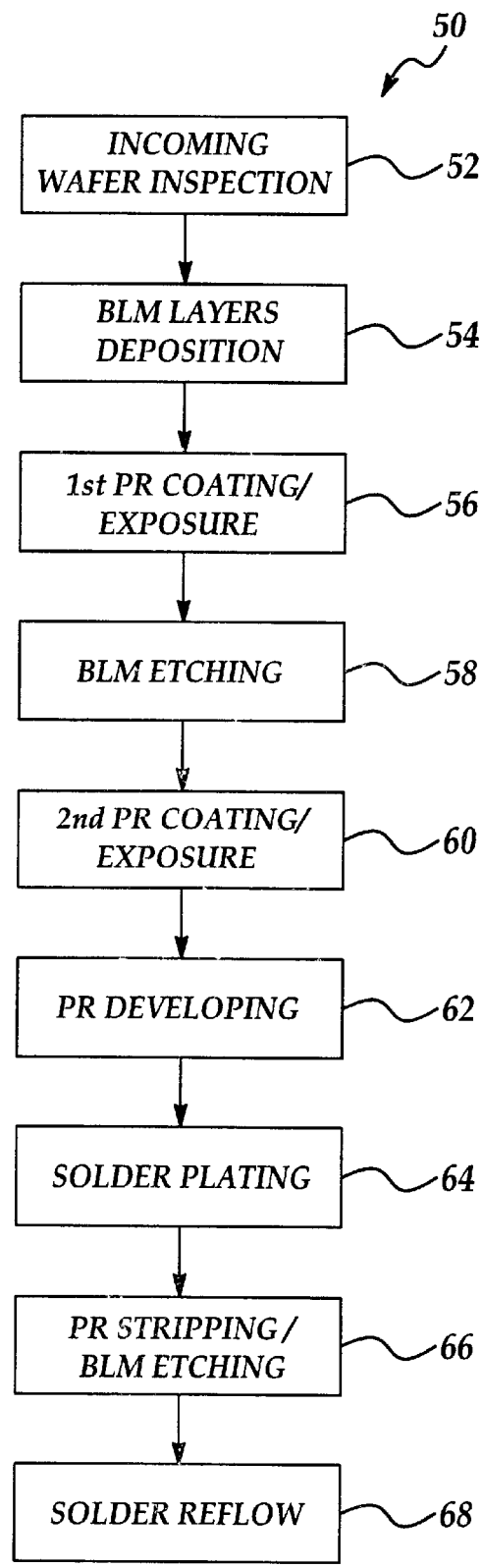
FIG. 2 is a process flow chart for the present invention dual-photoresist method for depositing fine-pitched solder bumps on flip chips

The present invention novel process can be described according to FIGS. 2 and 3A–3J. FIG. 2 shows a process flow chart for the present invention novel method. FIGS. 3A–3J illustrate a step-by-step cross-sectional views of the electronic structure fabricated accordingly to the present invention novel method.

Figure 3A:
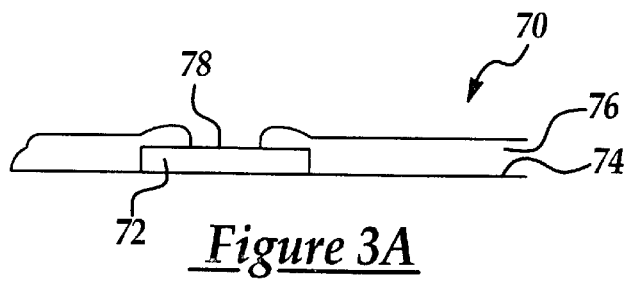
FIG. 3A is an enlarged, cross-sectional view of the present invention electronic structure having a bond pad and a passivation layer formed on top.
Figure 3B:
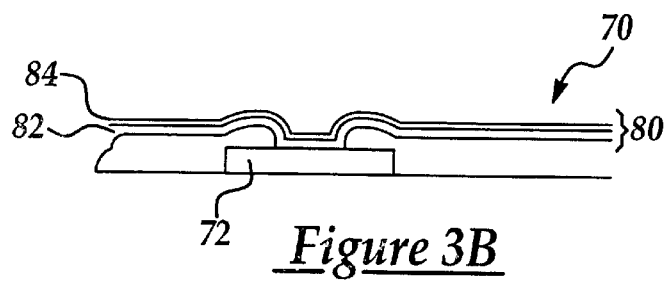
FIG. 3B is an enlarged, cross-sectional view of the present invention electronic structure of FIG. 3A having a ball-limiting-metallurgy layer deposited on top.

As shown in the process flow chart 50 as step 52 and further in FIG. 3A, an incoming wafer 70 that has an aluminum bond pad 72 formed on a top surface 74 and partially embedded in a passivation layer 76 is shown. The surface 78 of the aluminum bond pad 72 is at least partially exposed for establishing electrical communication with a solder bump to be formed thereon. A BLM layer 80 which consists of two or three sublayers, i.e., as shown in FIG. 3B and step 54 in FIG. 2, an adhesion layer 82 and a diffusion barrier layer 84, is deposited on top of the passivation layer 76 and the exposed top surface 78 of the aluminum pad 72. In the present illustration, a blanket layer of BLM is deposited on the entire surface area of the electronic substrate 70. The BLM layer may further include bonding, or wetting sublayer (not shown). Various metallic materials may be used for the sublayers, for instance, the adhesion sublayer may be formed of Cr or Ti, the barrier sublayer may be formed of Cu, Pd, Pt and Ni, while the bonding or wetting sublayer may be formed of Au or Pt. Sputtering is a suitable method for depositing such layers.

Figure 3C:
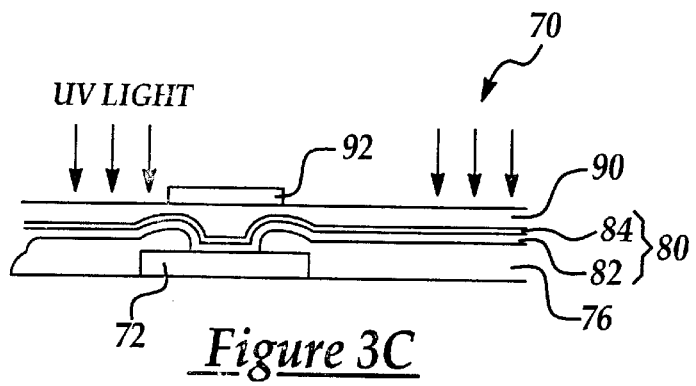
FIG. 3C is an enlarged, cross-sectional view of the present invention electronic substrate of FIG. 3B having a first photoresist layer deposited on top and a photomask positioned on top.
Figure 3D:
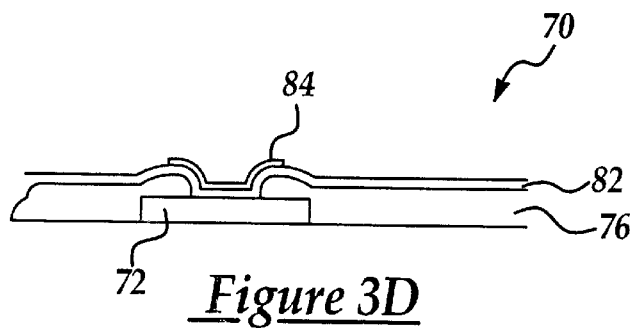
FIG. 3D is an enlarged, cross-section view of the present invention electronic substrate of FIG. 3C having the top BLM layer outside the solder ball area removed.

In the next step of the process, as shown in FIG. 2 as step 56 and in FIG. 3C, a first photoresist layer 90 of a smaller thickness is deposited, or coated on top of the electronic substrate 70. The first, thin photoresist layer has a thickness of not more than 10 μm, or a thickness between about 2 μm and about 5 μm. The small thickness of the first photoresist layer 90 allows a highly accurate photolithographic process to be carried out on the BLM layer 80 such that the position of the solder bumps can be precisely determined and patterned, i.e., at or near the center of the bond pad 72. The photolithographic method is carried out by using a bond pad photomask 92 which determines the exact location of the solder bump to be built thereon. After the first photoresist layer 90 is exposed by UV light and developed, the BLM layer 80 that is not under the protection of the photomask 92 is etched away in a wet etching or dry etching process. This is shown in FIG. 3D and in step 58 of FIG. 2.

Figure 3E:
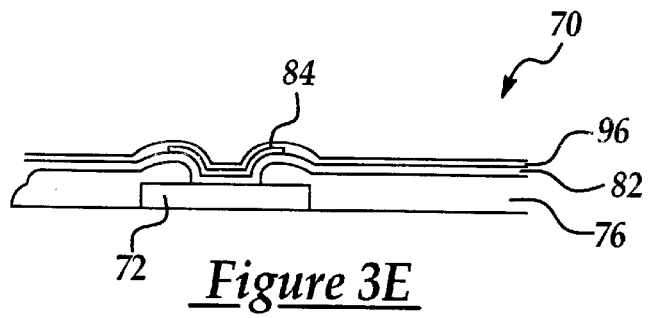
FIG. 3E is an enlarged, cross-sectional view of the present invention electronic substrate of FIG. 3D having an additional non-leachable metal layer of Cu or Ni deposited on top.

In the next step of the process as shown in FIG. 3E, an additional deposition step of a non-leachable metal may optionally be deposited on top of the BLM layers 84, 82. This is shown as layer 96 in FIG. 3E. The function of the optional non-leachable metal layer 96 is to further improve the electrical characteristics of the solder bump later formed on top of the bond pad 72. The non-leachable metal layer 96 can be suitably deposited of Cu or Ni. The name of non-leachable comes from the fact that metal atoms do not leach into a solder bump material that is subsequently deposited on top. The non-leachable metal layer is normally formed of a metal that has high electrical conductivity. The non-leachable metal layer 96 is normally deposited to a thickness of not more than 1 μm, or to a thickness between about 0.01 μm and about 1 μm, and preferably to a thickness between about 0.05 μm and 0.3 μm. The electronic substrate 70 is now prepared for the formation of via openings for the planting of solder bumps.

Figure 3F:
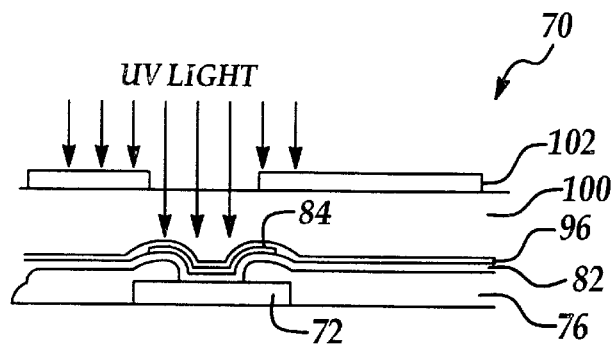
FIG. 3F is an enlarged, cross-sectional view of the present invention electronic substrate of FIG. 3E having a second photoresist layer of larger thickness deposited on top an a second photomask positioned on top.
Figure 3G:
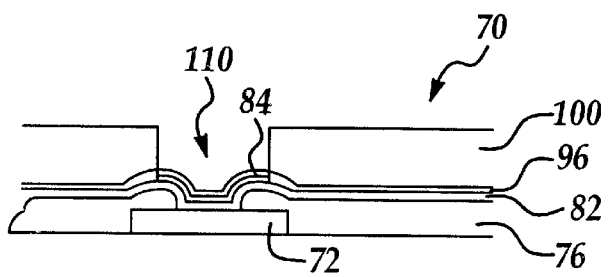
FIG. 3G is an enlarged, cross-sectional view of the present invention electronic substrate of FIG. 3F having a via opening over the remaining BLM layer formed in the second photoresist layer.

As shown in step 60 in FIG. 3F, a second photoresist layer 100 of significantly larger thickness than that of the first photoresist layer is coated on top of the electronic substrate 70. The thickness of the second photoresist layer 100 is substantially similar to a height of a solder bumper to be formed in the photoresist layer. For instance, the thickness of the second photoresist layer 100 should be sufficient for forming a solder ball after reflow at a thickness of not less than 50 μm. The second photoresist layer 100 is then patterned by a second photomask 102, as shown in FIG. 3F, to form a via opening 110. This is shown in FIGS. 3G and in step 62 of FIG. 2. The electronic substrate 70 is now prepared for the filling of via openings 110 with a solder material consisting mainly of Sn and Pb.

Figure 3H:
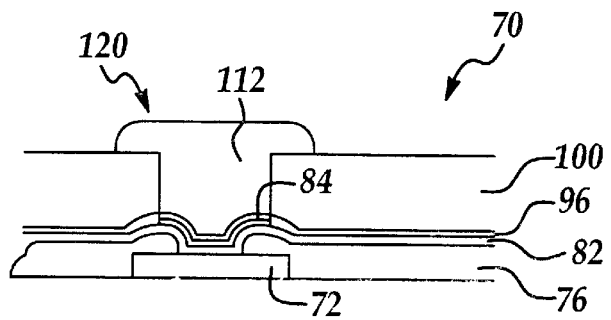
FIG. 3H is an enlarged, cross-sectional view of the present invention electronic structure of FIG. 3G having a solder material filling the via opening formed in the second photoresist layer.
Figure 3I:
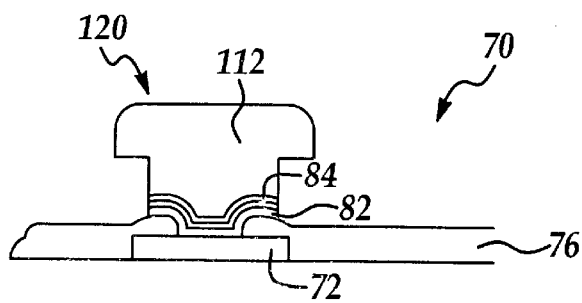
FIG. 3I is an enlarged, cross-sectional view of the present invention electronic structure of FIG. 3H having the second photoresist layer and the BLM layer removed by etching processes.

An electroplating or electroless plating technique can be used to fill the via opening 110 with a solder material 112 to form a mushroom-shaped solder bump 120, as shown in FIG. 3H and in step 64 of FIG. 2. The second photoresist layer 110 is then stripped in a wet etching process. A free standing mushroom 120 is left after the etching process. This is shown as step 66 in FIG. 2 and in FIG. 3I.

Figure 3J:
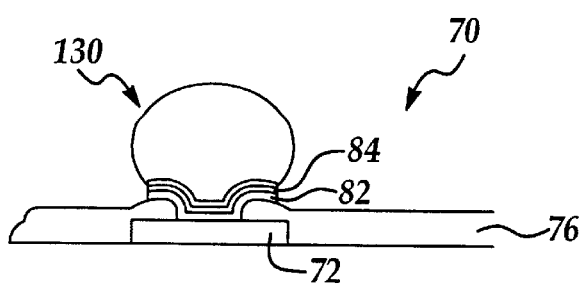
FIG. 3J is an enlarged, cross-sectional view of the present invention electronic structure of FIG. 3I having the solder bump reflown into a solder ball.

In the final step of the present invention novel method, as shown is step 68 of FIG. 2 and in FIG. 3J, a solder reflow process is carried out to reflow the solder bump 120 into a solder ball 130. Despite the fact the solder balls are built with a small pitch, the non-leachable metal layer can be easily removed without leaving any residue between the densely planted solder balls.

Figure 4A:
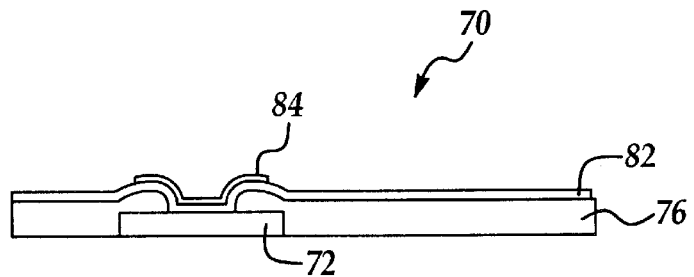
FIG. 4A is an enlarged, cross-sectional view of the alternate embodiment similar to that shown in FIG. 3D except that the bottom BLM layer (the adhesion layer) is not removed.
Figure 4B:
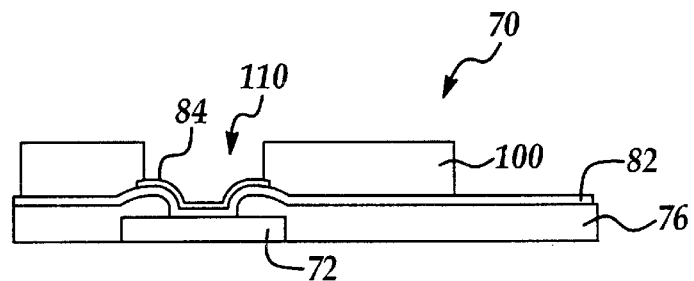
FIG. 4B is an enlarged, cross-sectional view of the structure of FIG. 4A with a via opening formed in a thick photoresist layer.
Figure 4C:
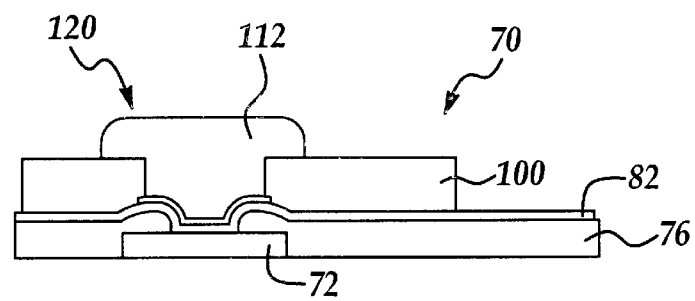
FIG. 4C is an enlarged, cross-sectional view of the structure of FIG. 4B with the via opening filled with a solder material.
Figure 4D:
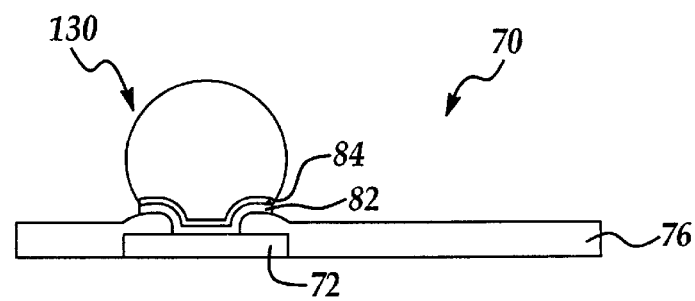
FIG. 4D is an enlarged, cross-sectional view of the structure of FIG. 4C with the solder bump reflown into a solder ball and the BLM layer removed.

FIGS. 4A–4D illustrate an alternate embodiment of the present invention method. In this alternate embodiment, when the BLM layer 80 is etched, only the top wetting layer 84 is etched away while the bottom adhesion layer 82 is saved for use as an electrode during electroplating. This is shown in FIG. 4A. A thick photoresist layer 100 is then coated on top of device 70, exposed and developed to form via opening 110, as shown in FIG. 4B. A SnPb bump 112 is then deposited by an electroplating process and reflowed into a solder ball 130. The adhesion layer 82 is then etched away. This is shown in FIGS. 4C and 4D. It should be noted that in this process, the last two steps of solder reflow and adhesion layer etching may be reversed, i.e., the adhesion layer 82 may first be removed before the solder bump 112 is reflown into solder ball 130.

The present invention novel method therefore enables a much improved process for fabricating fine-pitched solder balls on a flip chip or on any other suitable electronic substrate. The present invention novel use of a thin photoresist layer to pattern a BLM layer deposited on top of bond pads enables the precise positioning of the BLM layer on the pads. Furthermore, a self-alignment feature is achieved by the improvement in BLM pad size uniformity which is changed significantly from ±3 μm to ±1 μm. Moreover, due to the small thickness of the BLM layers remaining to be removed and the short etching time needed to remove them, the solder bumps are not oxidized in a wet etching process.

The present invention novel method and devices formed by the method have therefore been amply demonstrated in the above descriptions and in the appended drawings of FIGS. 2–3J. While the present invention has been described in terms of a preferred embodiment only, it is to be appreciated that those skilled in the art will readily apply these teachings to other possible variation of the invention.

The embodiment of the invention in which an exclusive property or privilege is claimed are defined as follows:

1. A method for forming solder bumps on flip chips comprising the steps of:
   providing an electronic substrate having a metal bond pad formed on top, said bond pad being embedded in an insulating layer with only a top surface exposed,
   depositing a ball-limiting-metallurgy (BLM) layer on top of said electronic substrate,
   coating a first photoresist layer on top of said BLM layer, said first photoresist layer having a first thickness that is sufficiently small such that an exposure accuracy of at least ±2 μm is obtained,
   etching said BLM layer away except an area over said bond pad,
   coating a second photoresist layer on top of said etched BLM layer, said second photoresist layer having a second thickness that is larger than said first thickness, forming a via opening in said second photoresist layer over said BLM layer and filling with a solder to form a solder bump, and
   removing said second photoresist layer and reflowing said solder bump into a solder ball.

2. A method for forming solder bumps on flip chips according to claim 1 further comprising the step of depositing a non-leachable metal layer on top of said etched BLM layer prior to the coating step for said second photoresist layer, said non-leachable metal does not leach into a solder bump material subsequently deposited on top.

3. A method for forming solder bumps on flip chips according to claim 2, wherein said non-leachable metal layer is formed of a metal having high electrical conductivity.

4. A method for forming solder bumps on flip chips according to claim 2, wherein said non-leachable metal layer is deposited of a material selected from the group consisting of Cu and Ni.

5. A method for forming solder bumps on flip chips according to claim 2, wherein said non-leachable metal layer is deposited to a thickness of not more than 1 μm.

6. A method for forming solder bumps on flip chips according to claim 2, wherein said non-leachable metal layer is deposited to a thickness between about 0.01 μm and about 1 μm.

7. A method for forming solder bumps on flip chips according to claim 2, wherein said non-leachable metal layer is deposited to a thickness preferably between about 0.05 μm and about 0.3 μm.

8. A method for forming solder bumps on flip chips according to claim 1, wherein said BLM layer comprises at least two sublayers selected from the group consisting of an adhesion sublayer, a barrier sublayer and a bonding sublayer.

9. A method for forming solder bumps on flip chips according to claim 8, wherein said adhesion sublayer is formed of a metal selected from the group consisting of Cr and Ti, said barrier sublayer is formed of a metal selected from the group consisting of Cu, Pd, Pt and Ni, and said bonding sublayer is formed of a metal selected from Au and Pt.

10. A method for forming solder bumps on flip chips according to claim 1, wherein said first thickness of said first photoresist layer is not more than 10 μm.

11. A method for forming solder bumps on flip chips according to claim 1, wherein said first thickness of said photoresist layer is between about 2 μm and about 5 μm.

12. A method for forming solder bumps on flip chips according to claim 1, wherein said second thickness of said second photoresist layer is substantially similar to a height of a solder bump formed in said via opening formed in said second photoresist layer.

13. A method for forming solder bumps on flip chips according to claim 1, wherein said second thickness of said second photoresist layer is sufficient to form a solder ball after reflow to a thickness of not less than 50 μm.

14. A method for forming solder bumps on flip chips according to claim 1, wherein said step of filling said via opening with a solder being carried out by a method selected from the group consisting of electroplating and electroless plating.

15. A method for forming fine-pitched solder bumps on a silicon wafer comprising the steps of:
   providing a silicon wafer having a multiplicity of bond pads formed on top,
   depositing a ball-limiting-metallurgy (BLM) layer on top of said multiplicity of bond pads, coating and patterning a first photoresist layer on top of said BLM layer, said first photoresist layer being coated to a thickness of not more than 10 μm,
   coating a second photoresist layer on top of said patterned BLM layer,
   defining and forming a multiplicity of via openings in said second photoresist layer exposing said multiplicity of bond pads,
   filling said multiplicity of via openings with a solder material forming a multiplicity of solder bumps, and removing said second photoresist layer.

16. A method for forming fine-pitched solder bumps on a silicon wafer according to claim 15 further comprising the step of reflowing said multiplicity of solder bumps into a multiplicity of solder balls.

17. A method for forming fine-pitched solder bumps on a silicon wafer according to claim 15 further comprising the step of depositing a non-leachable metal layer on top of said etched BLM layer prior to the coating step for said second photoresist layer, said non-leachable metal does not leach into a solder bump material subsequently deposited on top.

18. A method for forming fine-pitched solder bumps on a silicon wafer according to claim 17, wherein said non-leachable metal layer is deposited of a material selected from the group consisting of Cu and Ni.

19. A method for forming fine-pitched solder bumps on a silicon wafer according to claim 17, wherein said non-leachable metal layer is deposited to a thickness between about 0.01 $\mu$m and about 1 $\mu$m.

* * * * *